United States Patent [19]

Gurnee et al.

[11] Patent Number: 4,807,000

[45] Date of Patent: Feb. 21, 1989

[54] HIGH DENSITY SMALL ELEMENT OPTICAL MOSAIC DETECTOR

[75] Inventors: Mark N. Gurnee, Framingham; William J. White, Chelmsford, both of Mass.

[73] Assignee: Honeywell Inc., Minneapolis, Minn.

[21] Appl. No.: 20,618

[22] Filed: Mar. 2, 1987

[51] Int. Cl.[4] ............................................. H01L 27/14
[52] U.S. Cl. ....................................... 357/30; 357/71; 357/54; 357/32; 357/40; 357/24
[58] Field of Search ...................... 357/41, 30 B, 30 D, 357/30 G, 30 H, 30 P, 30 Q, 32, 24 LR, 54, 54 M, 71, 40

[56] References Cited

U.S. PATENT DOCUMENTS

| | | | |
|---|---|---|---|
| 4,286,278 | 8/1981 | Lorenze, Jr. et al. | 357/30 Q |
| 4,566,024 | 1/1986 | Fleury et al. | 357/32 |
| 4,695,861 | 9/1987 | Paine et al. | 357/30 H |
| 4,737,833 | 4/1988 | Tabei | 357/32 X |

FOREIGN PATENT DOCUMENTS

| | | | |
|---|---|---|---|
| 54-22882 | 2/1979 | Japan | 357/30 B |
| 58-180053 | 10/1983 | Japan | 357/32 |
| 59-112852 | 6/1984 | Japan | 357/30 B |

Primary Examiner—Andrew J. James
Assistant Examiner—William A. Mintel
Attorney, Agent, or Firm—Haugen and Nikolai

[57] ABSTRACT

A high density optical detector mosaic array assembly having a plurality of interconnect locations comprised of IC readout pads in a pattern suitable for interconnecting a plurality of integrated circuit devices. The assembly comprises a substrate, a plurality of thin film metallization layers alternating with a plurality of thick film dielectric layers wherein the first of the thin film layers is deposited directly on the substrate and is delineated to form a plurality of interconnect lines disposed in a pattern suitable to form a first row of the dectector mosaic at a first edge of the assembly and terminating at an interconnect location. Terminal pads are applied to each such interconnect line and the first thick film dielectric layer is deposited over the thin film interconnect line such that only the terminal pads are left exposed. Each alternating layer of thick film and thin film layers are similarly disposed to form a complete interconnect pattern suitable for interconnecting with the integrated circuit devices and a plurality of detector rows forming the detector mosaic interconnect lines. Bonding pads are applied to the detector mosaic such that the fill factor for detectors is about 100% for bonding pads on centers in the range of about 25 micrometers.

7 Claims, 5 Drawing Sheets

HIGH DENSITY SMALL ELEMENT OPTICAL MOSAIC DETECTOR

The Government has rights in this invention pursuant to Contract No. DASG60-84-C-D052 awarded by the Department of the Army.

BACKGROUND OF THE INVENTION

1. Field of the Invention

The present invention is directed to optical detectors and, more particularly, to high density optical detector mosaic arrays for use in infrared sensing systems.

2. Discussion of the Prior Art

Known techniques for creating an area array of optical detectors required layering discrete alumina boards having metallized traces. A typical array manufactured by such a process could result in an array formatted on 4 mil centers. Such an approach, however, is not optimum for very small detectors of the order of 25 micrometers in size. The fill factor of an array of such small detectors utilizing the know technology would be unacceptably low. The present invention is directed to a method of packing an area array of small detectors in a very dense format (small cells and fill factor) using a combination of hybrid thin film and thick film on the same substrate.

SUMMARY OF THE INVENTION

A high density small element optical mosaic detector is disclosed. The detector comprises a substrate, a plurality of alternating thin film metallization and insulation layers and means for bonding detectors to the detector mosaic.

BRIEF DESCRIPTION OF THE DRAWINGS

FIG. 1a shows a detail of the detector mosaic array 10 of FIG. 1 as defined by taking a cut along 1a—1a.

FIG. 1b shows an expanded view of a cross-section of the detector mosaic as defined by taking a cut along section 1b—1b of FIG. 1a.

DETAILED DESCRIPTION OF THE PREFERRED EMBODIMENT

Figure 1:
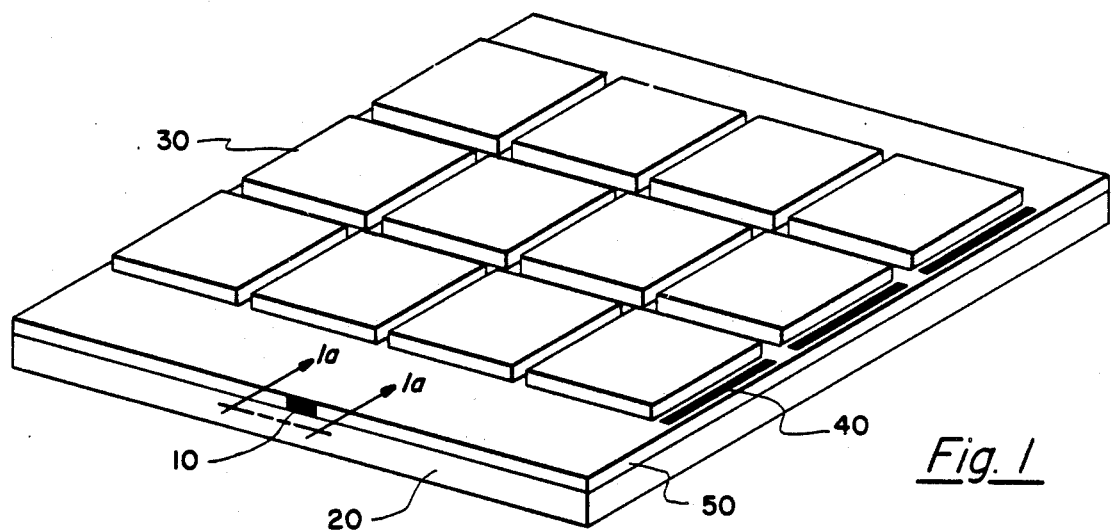
FIG. 1 shows a focal plane layout of one embodiment of a high density optical detector mosaic array assembly.

Referring now to FIG. 1, a focal plane layout of one embodiment of a high density optical detector mosaic array assembly is shown. The assembly comprises a detector mosaic 10, a substrate 20, a plurality of integrated circuit devices 30 (also referred to herein as "readout ICs"), IC readout pads 40, and a multilayer alternating thick film and thin film interconnect pattern 50. The detector mosaic 10 further comprises rows and columns of optical detectors disposed to receive radiation, such as infrared radiation, in a configuration having small cells and high packing density. A portion of this mosaic is shown in detailed blow-up FIG. 1a.

Figure 1A:
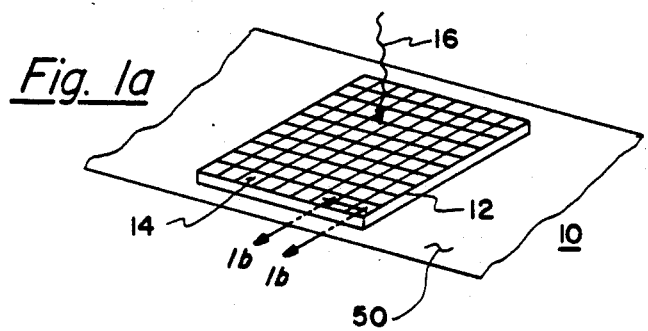

With reference now to FIG. 1a, a detail of the detector mosaic 10 is figuratively illustrated. The mosaic comprises optical detectors 1 disposed in an array of rows and columns in a pattern suitable to receive radiation 16 which impinges upon the faces of the detectors wherein the faces are arranged to reside within the same plane which is called the "sensitive area plane" 12. Radiation 16 then impinges on the faces of the detectors 14 in the sensitive area plane. Such optical detectors may advantageously be comprised of mercury cadmium telluride (HgCd)Te, or other well-known optical detector materials.

Figure 1B:
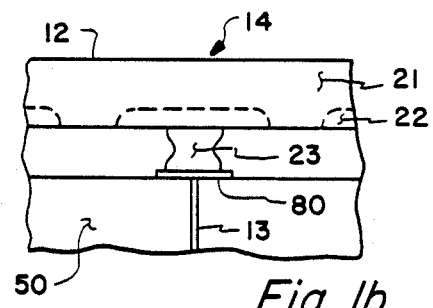

FIG. 1b shows a detailed cross-section of the detector mosaic as revealed by taking a cut along section 1b—b of FIG. 1a. The detail of FIG. 1b illustrates the bonding construction of a typical detector 14 to the bonding pads 80. Typically, each detector 14 includes a detector crystal region 21 having a junction 22 which is further connected to an indium bump 23. The indium bump 23 bonds to the bonding pad 80 which is, in turn, bonded to a metallized trace 13.

The sensitive area plane 12 is parallel to the plane formed by the edge of the supporting substrate and multilayer thick/thin film interconnect pattern 50. Therefore, metallized traces (also called electrical leadouts) 13 from the rows and columns of the detectors exit orthogonal to the sensitive area plane. In the present invention, leadouts are formed in layers, with detector connections formed from detector bonding pads 80 at one end or side of an aluminum oxide or similar substrate. The conductive metal lines on each layer within pattern 50 form and interconnect between detector bonding pads 80 and integrated circuit readout pads 40 as shown in FIG. 1. Such leadouts may advantageously be gold/chrome, nickel, molybdenum, tungsten, or other conductor metals that can be deposited as a thin film. The integrated circuit readout bonding pads may be of the CCD or other electronic signal processing type. These leadouts and bonding pads are described in more detail below.

Referring again to FIG. 1, the plurality of integrated circuit devices 30 may advantageously be readout integrated circuits including amplifiers and multiplexers which are well-known by those practicing in the art of optical detectors. The circuits are connected by means of jumper wires or other electrical connecting means such as surface mounting or flip chip bumping to the IC readout pads 40.

Figure 2:
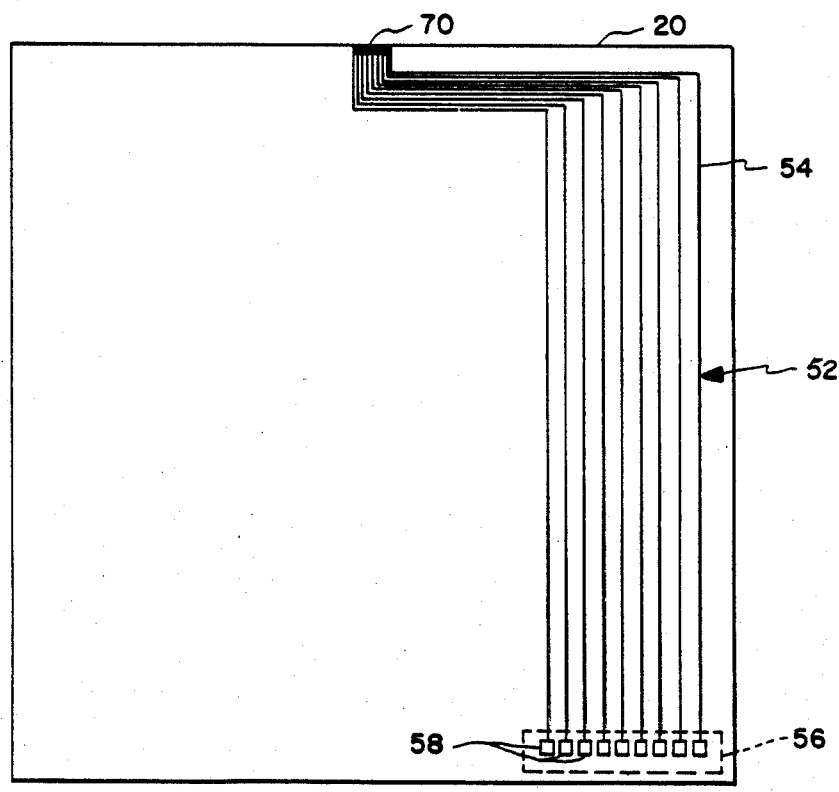
FIG. 2 shows thin film metallization interconnect layer number 1.

Referring now to FIG. 2, an example of a first thin film interconnect layer is shown. The first thin film metallization layer 52 is deposited directly on the substrate 20 and is delineated as shown to form a plurality of interconnect lines 54 disposed such that the edges of the interconnect lines are formed in a pattern suitable to form a first row of metal edges 70 at a first edge of the assembly and terminating at a first interconnect location 56 whereon terminal pads 58 are applied to each such interconnect line 54. The metal edges 70 are shown in more detail in FIG. 6.

Figure 3:
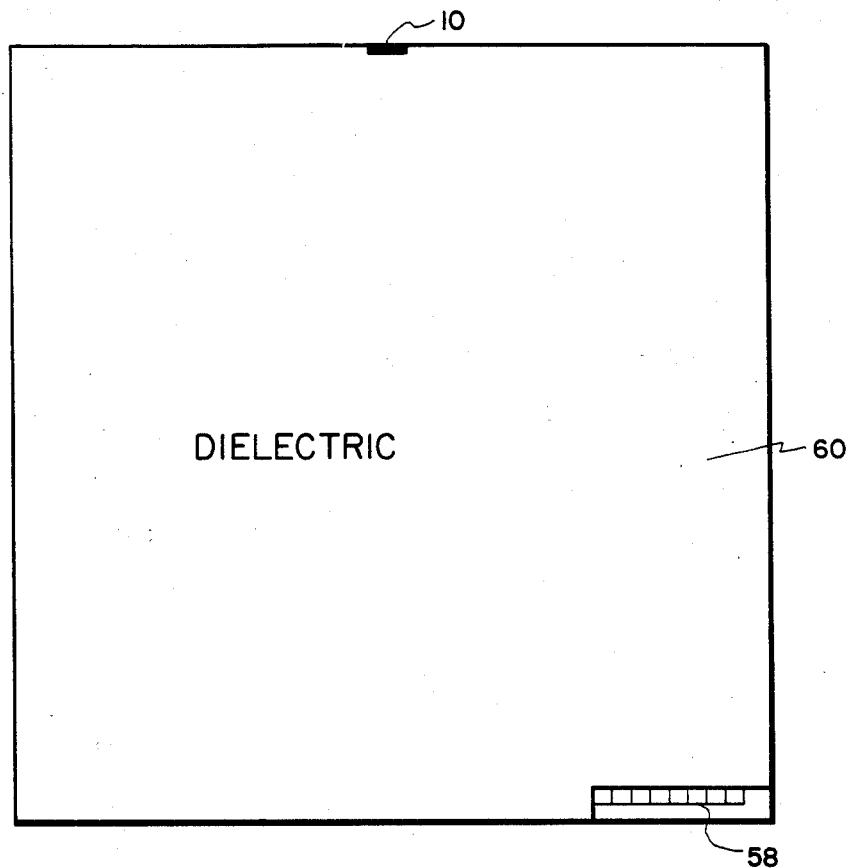
FIG. 3 shows thick film dielectric layer number 1.

Referring now to FIG. 3, a first thick film dielectric layer 60 is shown. The first thick film dielectric layer 60 is deposited over the thin film interconnect lines 54 (not shown) such that only the terminal pads 58 are left exposed. The thick film dielectric layer 60 must have a thickness matched to a detector width, which is typically approximately 25 micrometers.

In the manner as described with reference to FIGS. 2 and 3 above, a number of thin film metal and thick film dielectric layers will be deposited over the first dielectric layer, therefore, it may be advantageous to lap and/or polish the first dielectric layer. One skilled in the art will recognize that the surface may also advantageously be treated to enhance thin film metal adhesion. The process of depositing a thin film metal layer, delineating the layer, depositing a thick film dielectric layer and lapping and polishing the thick film layer is repeated for the detector interconnect lines (as shown in FIG. 6) in each row of the mosaic array until the entire set of rows of metal edges 70 are connected to corresponding IC readout pads at interconnect locations deposited in a pattern suitable for interconnecting with a plurality of integrated circuit devices, and a detector mosaic array.

Figure 4:
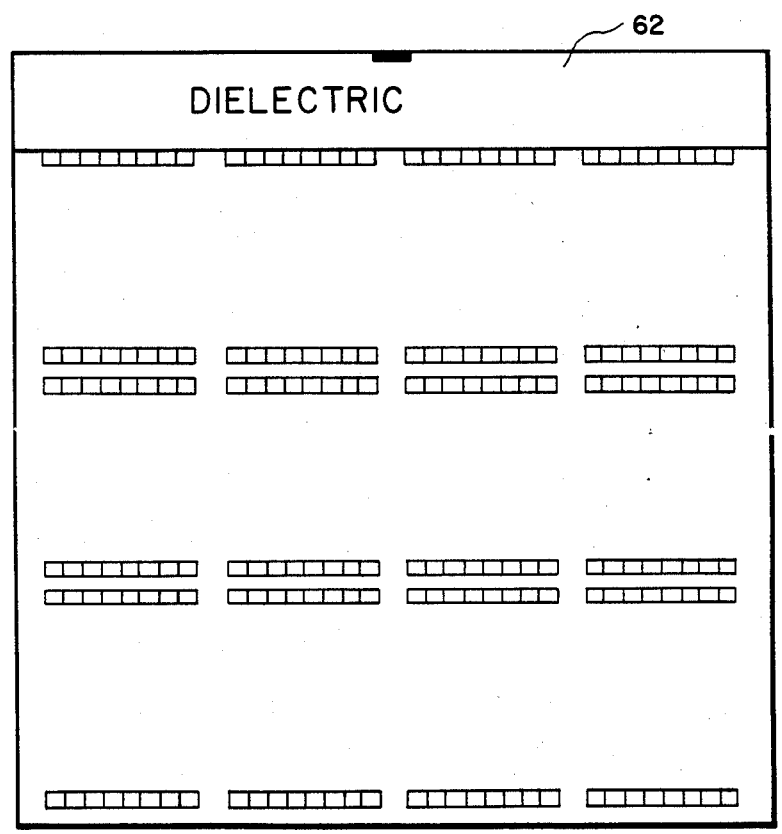
FIG. 4 shows a final thick film dielectric layer and the pattern of a plurality of interconnect locations in a pattern suitable for interconnecting with a plurality of integrated circuit devices.

FIG. 4 shows the final thick film dielectric layer of the assembly. The final thick film dielectric layer 62 is deposited after the last thick film metallization layer has been deposited and all interconnect points described by pads 58 within the interconnect locations 56 (as shown in FIG. 2) have been connected with the mosaic detector array.

Figure 5:
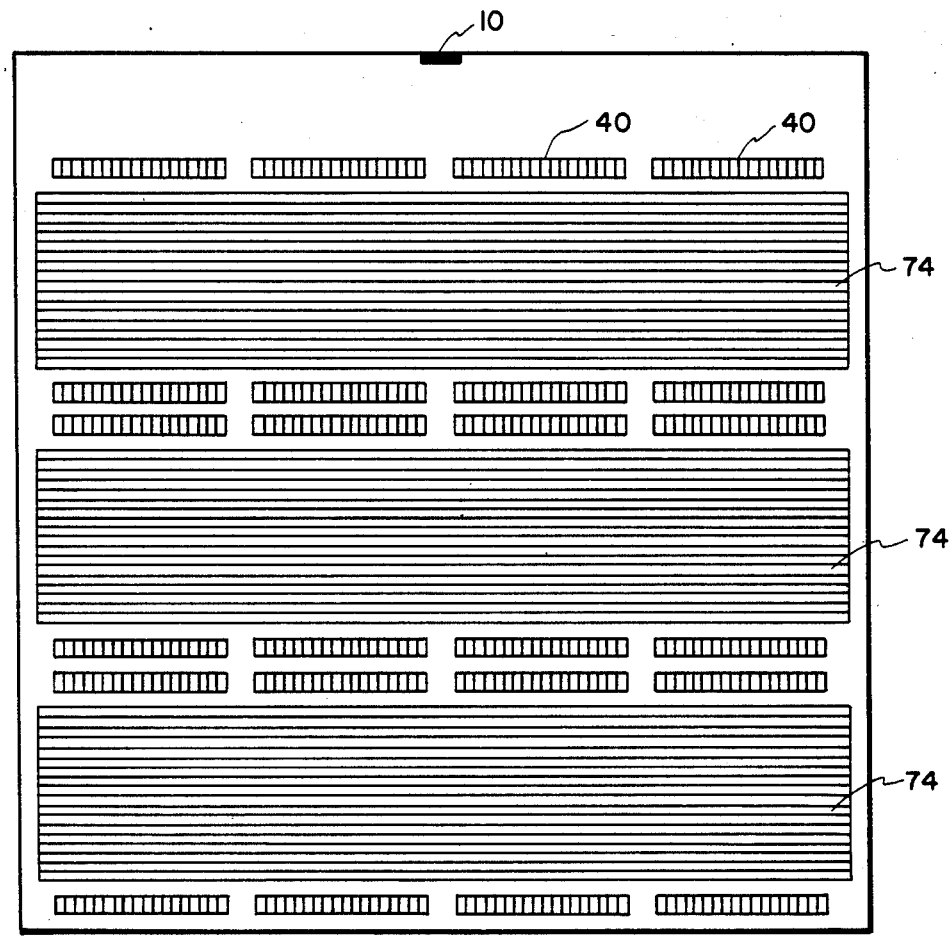
FIG. 5 shows the integrated circuit readout interconnect pattern of the invention.

Referring now to FIG. 5, an IC readout interconnect pattern is shown. When there are sufficient layers of thin film metallization and thick film dielectric to connect all of the detectors to corresponding interconnect points, a final dielectric 74 is deposited and an IC readout interconnect pattern comprised of IC readout pads 40 is deposited over interconnect lines 54 (shown in FIG. 2).

Figure 6:
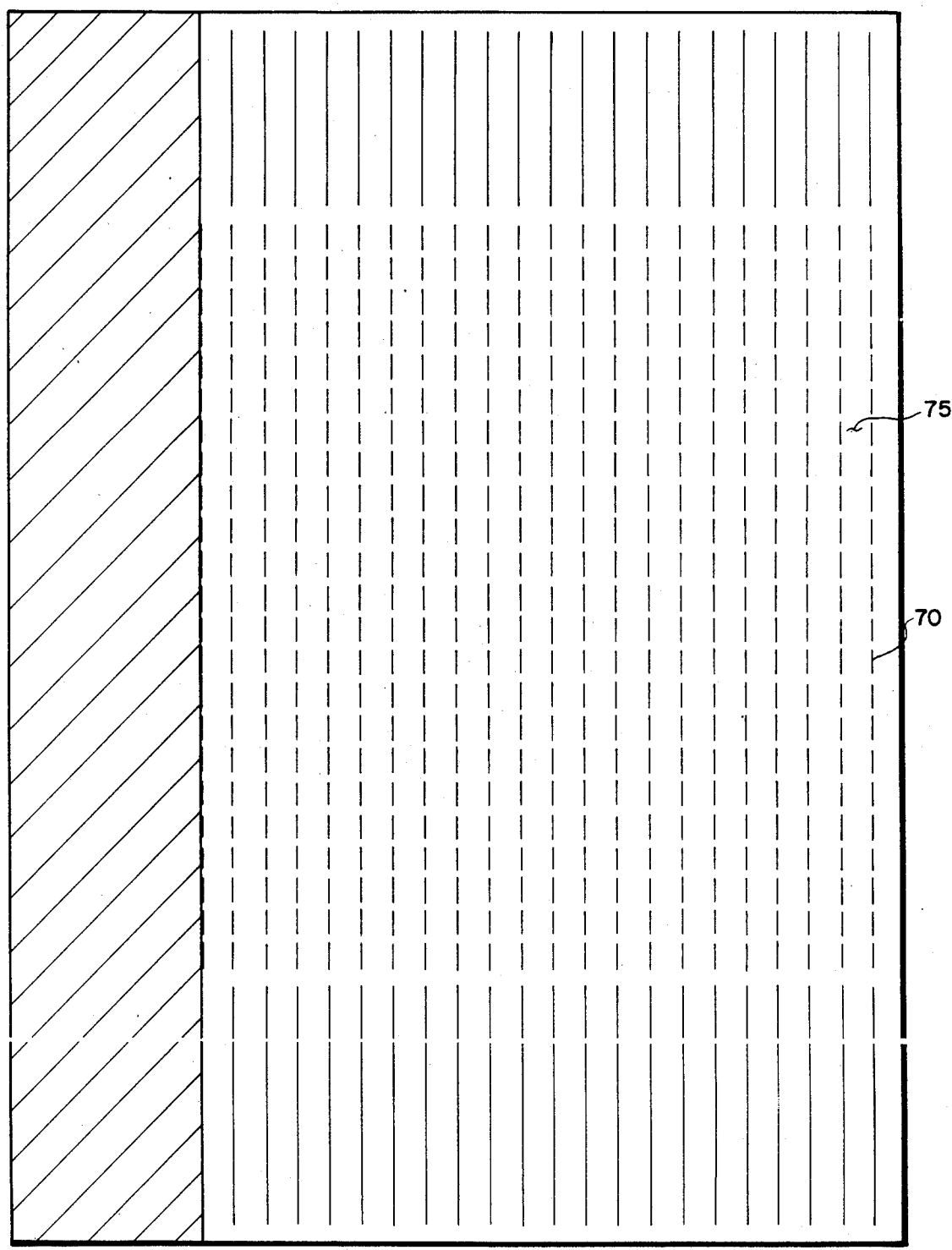
FIG. 6 shows a lapped edge of the focal plane substrate of the invention showing the exposed terminated edge of detector interconnect lines.
Figure 7:
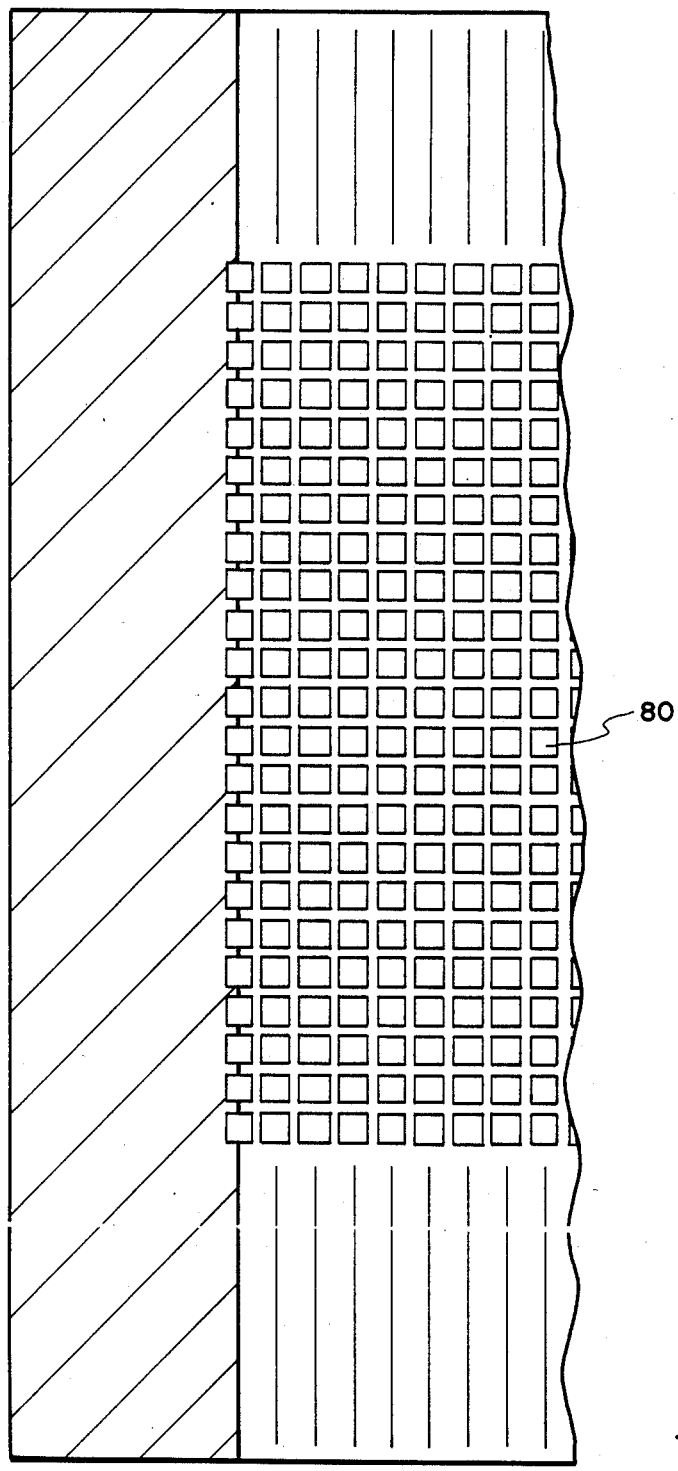
FIG. 7 shows detector bonding pads deposited on the lapped edge of the focal plane substrate.

Referring now to FIG. 6, a lapped edge of the focal plane substrate is shown exposing the array of metal edges 70 which are the edges of interconnect lines 54. In order to form the detector bonding pads 80 (shown in FIG. 7), the rough edge surface 75 where the detector leads reside after the abovedescribed layering process is complete, may be smoothed by lapping and etching thereby preparing the array of metal edges 70 upon which bonding pads may then be deposited. FIG. 7 shows the detector bonding pads 80 deposited on the previously lapped edges which were shown in FIG. 6. Detectors forming the detector mosaic would then be connected by well known electrical connecting means, such as indium bumping, to the bonding pads 80. The approach to forming a detector mosaic herein described is optimum for very small detectors of the order of 25 micrometers in size, and would give an affect of 100% fill factor where the small detector is in a finite mosaic format.

While there has been shown and described a preferred embodiment of the invention, those skilled in the art will appreciate that various changes and modifications may be made to the illustrated embodiment without departing from the true spirit and scope of the invention which is to be determined from the appended claims.

The embodiments of an invention in which an exclusive property or right is claimed are defined as follows:

1. A high density optical detector mosaic array assembly having a plurality of interconnect locations comprised of IC readout pads in a pattern suitable for interconnecting a plurality of integrated circuit devices comprising:

a substrate:

B. a plurality of metallization layers alternating with a plurality of dielectric layers thicker than said metallization layers wherein the first of the metallization layers is deposited directly on the substrate and is delineated to form a plurality of interconnect lines disposed in a pattern suitable to form a first row of the detector mosaic interconnect lines at a first edge of the assembly, the metallization layer terminating at an interconnect location whereon terminal pads are applied to each such interconnect line, and wherein the first dielectric layer is deposited over the interconnect lines such that only the terminal pads are left exposed and wherein each alternating layer of dielectric and metallization layers are similarly disposed to form a complete interconnect pattern suitable for interconnecting with the integrated circuit devices at a plurality of interconnect locations and to also form a plurality of detector rows forming the detector mosaic interconnect lines at the first edge of the assembly; and C. means for bonding detectors to the detector mosaic.

2. The apparatus of claim 1 additionally including a plurality of detectors bonded to the bonding means.

3. The apparatus of claim 2 wherein the means for bonding detectors to the detector mosaic comprise nominally square bonding pads deposited on the terminating edges of the detector interconnect lines in the detector mosaic.

4. The apparatus of claim 3 wherein the substrate comprises aluminum oxide.

5. The apparatus of claim 4 wherein the detector interconnect lines are selected from the group consisting of gold/chrome, nickel, molybdenum, tungsten, and other conductor metals that can be deposited as a thin film.

6. The apparatus of claim 5 wherein the detectors are comprised of mercury cadmium telluride.

7. The apparatus of claim 6 wherein the detectors have an area of no greater than about 50 micrometers square.

* * * * *